(12) United States Patent
Morgan et al.

(10) Patent No.: US 11,804,281 B2
(45) Date of Patent: Oct. 31, 2023

(54) APPARATUSES SYSTEMS AND METHODS FOR AUTOMATIC SOFT POST PACKAGE REPAIR

(71) Applicant: MICRON TECHNOLOGY, INC., Boise, ID (US)

(72) Inventors: Donald M. Morgan, Boise, ID (US); Alan J. Wilson, Boise, ID (US); Bryan D. Kerstetter, Boise, ID (US); John D. Porter, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 235 days.

(21) Appl. No.: 17/450,582

(22) Filed: Oct. 12, 2021

(65) Prior Publication Data

US 2023/0116534 A1 Apr. 13, 2023

(51) Int. Cl.
*G06F 11/00* (2006.01)
*G11C 29/00* (2006.01)
*G06F 11/16* (2006.01)
*G06F 11/18* (2006.01)

(52) U.S. Cl.
CPC .............. *G11C 29/70* (2013.01); *G06F 11/16* (2013.01); *G06F 11/1666* (2013.01); *G06F 11/18* (2013.01)

(58) Field of Classification Search
CPC ...... G06F 11/16; G06F 11/1666; G06F 11/18; G11C 29/70
See application file for complete search history.

(56) References Cited

U.S. PATENT DOCUMENTS

| | | | |
|---|---|---|---|
| 10,403,390 B1* | 9/2019 | Wilson | G11C 29/76 |
| 2015/0287480 A1* | 10/2015 | Wilson | G11C 29/04 365/96 |
| 2020/0117558 A1* | 4/2020 | Wilson | G06F 11/1008 |
| 2020/0151070 A1* | 5/2020 | Lee | G06F 12/10 |
| 2021/0182135 A1* | 6/2021 | Gurumurthi | G06F 11/1064 |
| 2021/0263646 A1* | 8/2021 | Chin | G06F 11/073 |

* cited by examiner

*Primary Examiner* — Joshua P Lottich
(74) *Attorney, Agent, or Firm* — Dorsey & Whitney LLP

(57) ABSTRACT

Embodiments of the disclosure are drawn to apparatuses and methods for automatic soft post-package repair (ASPPR). A memory may receive a row address along with a signal indicating an ASPPR operation, such as a bad page flag being set. A word line engine generates a physical address based on the row address, and ASPPR registers stores the physical address. The time it takes from receiving the row address to storing the physical address may be within the timing of an access operation on the memory such as tRAS. The row address may specify a single page of information. If the bad page flag is set, then a subsequent PPR operation may blow fuses to encode the physical address stored in the ASPPR registers.

22 Claims, 4 Drawing Sheets

APPARATUSES SYSTEMS AND METHODS FOR AUTOMATIC SOFT POST PACKAGE REPAIR

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines). At various points in manufacturing and use of a memory device, one or more memory cells may fail (e.g., become unable to store information, be inaccessible by the memory device, etc.) and may need to be repaired.

The memory device may perform repair operations on a row-by-row basis. A row containing a failed memory cell (which may be referred to as a defective row, a bad row, or a faulty row) may be identified. The memory device may contain additional rows of memory (which may also be referred to as redundant rows) which may be used in repair operations. During a repair operation, an address associated with the defective row may be redirected, such that the address points to a redundant row instead. Some repairs may be performed after a device is packaged (e.g., in a chip, on a device, etc.). These repairs may generally be quite time consuming, and may also be difficult if the memory is capable of remapping the relationship between addresses and word lines. There may be a need for temporary repair of word lines which is fast and specific to a particular page (e.g., logical address).

DETAILED DESCRIPTION

Figure 1:
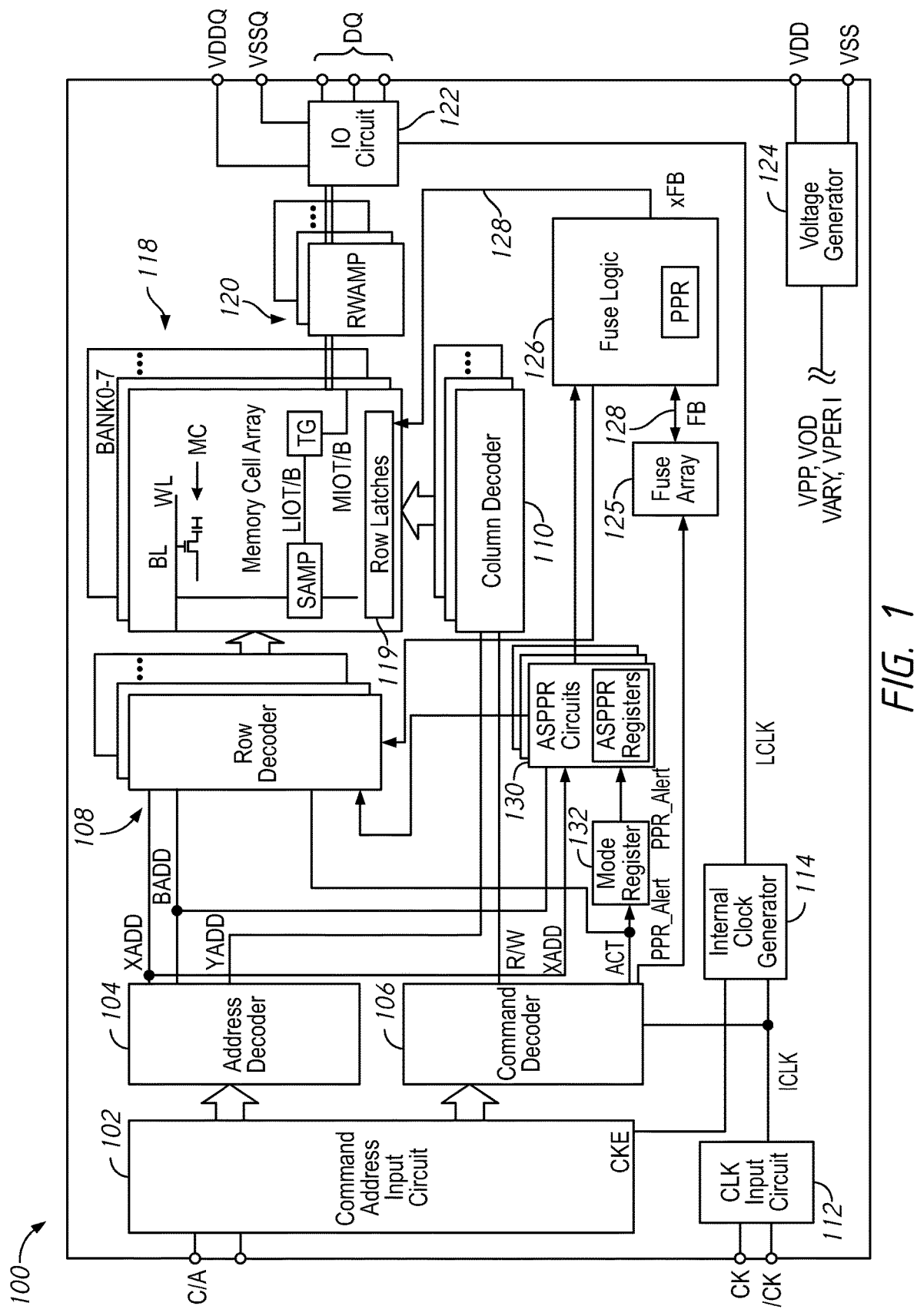
FIG. 1 is a block diagram of a semiconductor device according to at least some embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in a plurality of memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column). The data which is associated with a single logical row address, may also be referred to as a page. The memory may include logic which maps the logical address (e.g., a row, column, and bank address) to a physical address (e.g., a word line, bit line, and bank). Some memories may use wear leveling, and periodically alter the mapping of logical and physical addresses to redistribute access operations among the physical memory cells.

Certain memory cells may be defective, and rows containing the defective memory cells may generally be referred to as defective rows (or bad rows or faulty rows). The defective rows may be incapable of storing or retaining information and/or may become otherwise inaccessible to the memory device. In some cases, memory may become defective (and/or may be identified as defective) after the memory device is packaged (e.g., sealed in a chip package). The memory device may carry out one or more types of post-package repair (PPR) operation to resolve the defective rows.

For example, memory banks may generally include a number of additional rows of memory, which may generally be referred to as redundant rows. During a repair operation, a row address associated with a defective row may be redirected so that it is associated with one of the redundant rows instead. In some modes of operation, the repair operation may be a hard (or permanent) repair operation, where updated row address information is stored in the memory in a non-volatile form (e.g., stored in a manner that is maintained even when the memory device is powered down). For example, the memory device may include a fuse array, which may include fuses (and/or anti-fuses) which may have state that can be permanently changed (e.g., when the fuse/anti-fuse is "blown"). For the sake of brevity, the term 'fuse' as used herein may be understood to include any non-volatile storage element, such as a fuse, anti-fuse, etc. The state of the fuses in the fuse array may, in part, determine which addresses are associated with which rows of memory.

During a soft PPR operation (an SPPR operation) non-volatile elements may be used to track repairs. The address of the address of the row to be repaired may be stored in non-volatile elements (e.g., latch circuits) so that information which would have been directed to the row to be repaired is directed to a redundant row instead. In some embodiments, the SPPR latches may each be associated with a designated redundant row. In some embodiments, the SPPR circuits may scan to locate open redundant rows, and may assign each defective address to an open redundant row. The SPPR process may allow repairs to be temporarily performed (e.g., for testing purposes) before they are permanently made. However, in some devices, such as those where wear leveling is used, SPPR operations may lead to problems. For example, the process of loading SPPR addresses may be relatively slow, and situations may arise where a device alters the logical to physical address mapping between the time a logical address of the bad row is received and a soft repair is performed to remap accesses on the physical word line. There is thus a need for sPPR operations which are relatively rapid, and which automatically capture the physical address (e.g., the word line) to be repaired.

The present disclosure is generally directed to automatic soft post package repair (ASPPR). A controller may monitor a memory to locate bad pages of the data (e.g., the data associated with a single logical row address). The controller may provide a row address along with a bad page command. The bad page command may take advantage of existing communication architecture. For example the controller may provide the row address and a row activate command over a command/address (CA) bus, and also provide a bad page flag which may be set in a mode register of memory. The bad page flag being set may indicate that the address provided along the bus is for an ASPPR operation and not for accessing. The logical address may be provided along normal address bussing through the memory to bank logic, which includes a word line engine which converts the received logical address to a physical address. The physical address may be stored in an ASPPR register. Since the physical address is saved (rather than the logical address), even if the relationship between physical and logical addresses is remapped (e.g., as part of wear leveling) the proper physical address associated with the defective word line will be saved. If a subsequent hard repair is performed, and the bad page flag is set, indicating that an ASPPR operation was previously performed, then the saved physical address in the ASPPR register may be used for the hard repair (e.g., by blowing one or more fuses based on the stored physical address). The bad page flag may be unset after the PPR operation.

The use of the normal CA bus and row address bus in the memory may allow the physical address to be saved to the ASPPR in a much faster time frame than it would take to load the SPPR address in a conventional fashion (e.g., through a fuse logic scan operation). For example, loading the word address to the ASPPR latches may take approximately the same amount of time or less as a normal access operation (e.g., the timing of tRAS). In some embodiments, the data from the failed word line may be rewritten to the redundant word line, which may help preserve data in the memory.

FIG. 1 is a block diagram of a semiconductor device according to at least some embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The device also includes a fuse array 125, which contains a plurality of non-volatile storage elements (fuses) which may store information about addresses in the memory array 118. Each fuse may start in a first state (e.g., an anti-fuse may be insulating), and may be 'blown' to permanently change the fuse's state (e.g., a blown anti-fuse may be conductive). Each fuse may be considered to be a bit, which is in one state before it is blown, and permanently in a second state after it's blown. For example, a fuse may represent a logical low before it is blown and a logical high after it is blown.

Specific groups of fuses may be represented by a fuse bank address FBA, which may specify the physical location of each of the fuses in the group within the fuse array 125. The group of fuses associated with a particular FBA may act as a row repair element (RRE). The RRE may be encoded with a row address to be repaired (e.g., by blowing fusing to encode a binary string of the row address). The RRE may be associated with a particular redundant row of the memory array 118. The address information in the fuse array 125 may be 'scanned' out along a fuse bus (FB and xFB) 128 to row latches 119. Each row latch 119 may be associated with a particular wordline of the memory array 118. In some embodiments, only the redundant rows of the memory array 118 (e.g., the rows designated for use in repair operations) may be associated with one of the row latches 119. The address stored in a given RRE may be scanned out from the fuse array 125 along the fuse bus 128, and may be latched by a particular row latch 119. In this manner, an address stored in an RRE the fuse array 125 may be associated with a particular row of the memory array 118. The address stored in the row latch 119 may then direct access commands to the wordlines associated with the row latch 119. Accordingly, programming a row address into an RRE of the fuse array 125 may repair that row address by reassigning it to a redundant word line.

A fuse logic circuit 126 may be positioned along the fuse bus 128. The fuse logic circuit 126 may include post package repair (PPR) circuits (e.g., hard PPR circuits) which may be used to make changes to the fuse array 125 after the memory device 100 is packaged (e.g., packaged into a chip). For example, the PPR circuits may perform a hard repair, where fuses in an RRE the fuse array 125 are blown to 'repair' a row by encoding the repaired row address permanently into the RRE in the fuse array 125. The fuse logic circuit 126 may also include soft PPR circuits (SPPR circuits) (not shown) which include volatile memory elements which may be used to make non-permanent repairs. The fuse logic circuit 126 may monitor the data along the fuse bus 128 and may selectively alter the data to provide an altered fuse bus xFB based on the addresses stored in the SPPR circuits.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and mite commands for performing write operations, as well as other commands and operations. Access operations may generally be accompanied by a row activate command ACT. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder may access the wordline associated with the row latch 119 which has an address which matches XADD. The read command is received by the command decoder 106, which provides internal commands so that read data from the memory array 118 is provided to the read/write amplifiers 120. The row decoder 108 may match the address XADD to an address stored in a row latch 119, and then may access the physical row associated with that row latch 119. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. The row decoder 108 may match the address XADD to an address stored in a row latch 119, and then access the physical row associated with that row latch 119. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 includes ASPPR circuits 130, which may be used to rapidly and automatically perform ASPPR operations. The ASPPR operations may replace and/or be in addition to any other form of SPPR operation that the fuse logic 126 may perform. The ASPPR circuits 130 include a number of ASPPR registers which are used to store addresses for repair. Each ASPPR register may be associated with a redundant row. In some embodiments, these redundant rows are set aside for ASPPR operations, and are not available for other types of repair operation.

The ASPPR registers may store physical addresses which are associated with a specific word line, rather than a logical address (e.g., XADD). Each stored physical address may be based on a row address XADD which specified a single page's worth of data (e.g., the data along a single word line). A word line engine may convert a received logical address XADD into a physical address PA which may be saved in the ASPPR registers. Subsequently, when a row address XADD is accessed, the row address may be converted to a physical address and compared to the stored physical addresses. If there is a match, a signal ASPPR match is provided. Responsive to ASPPR match, a redundant row associated with that ASPPR register is accessed by the row decoder 108 instead of whichever word line was previously associated with the physical address.

In some embodiments, when the ASPPR operation is performed, data may be copied from the word line of previously associated with the physical address to the redundant word line associated with the ASPPR register.

The address to be repaired may be loaded into the ASPPR registers via the normal C/A buses. For example, a controller may provide an address XADD along with an ACT signal, and also an ASPPR flag (e.g., a bad page flag) may be written to a mode register 132. The ASPPR flag may indicate that the address XADD is intended as a row to be repaired as part of an ASPPR operation, and not for accessing. The row address XADD may be automatically converted into a physical address and that physical address may be loaded into an available ASPPR register. The ASPPR flag (or a different ASPPR flag) may be set in the mode register 132 to indicate that an ASPPR repair was performed. For example, there may be a number of bank specific ASPPR flags, each of which may indicate that an ASPPR repair was performed in one of the memory device's 100 banks.

If a subsequent PPR operation is performed, and one or more ASPPR flags is set, the address saved in the ASPPR register (e.g., a physical address PA) may be provided to the fuse logic, which may perform a PPR operation based on the saved PA. This may be useful in situations where the mapping of logical and physical addresses changes over time (e.g., to adjust for wear leveling). This may also allow a controller to automatically perform the PPR operation by providing a PPR signal and allowing the memory device 100 to repair the already saved addresses in the ASPPR registers.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
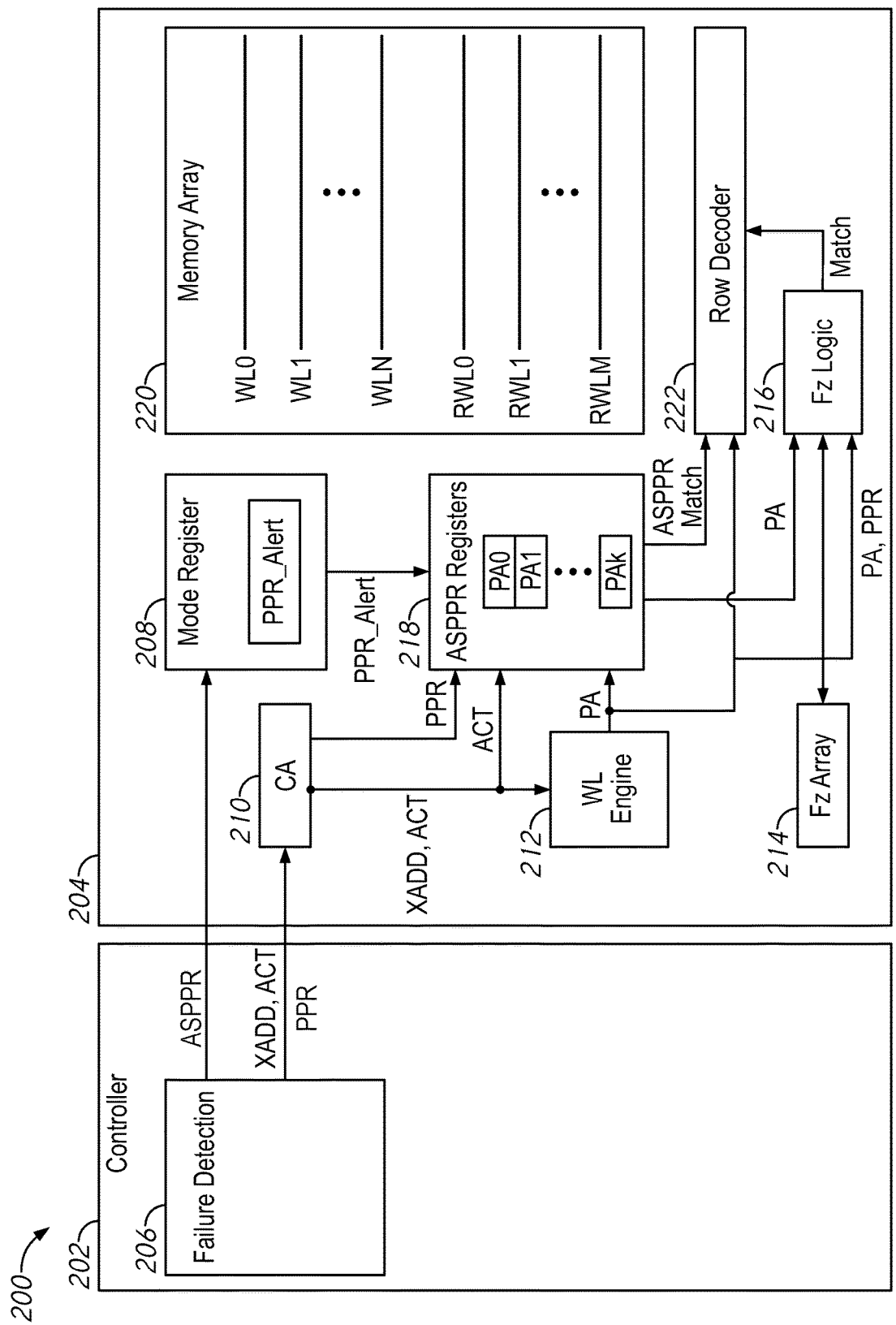
FIG. 2 is a block diagram of a memory system according to some embodiments of the present disclosure.

FIG. 2 is a block diagram of a memory system according to some embodiments of the present disclosure. The system 200 includes a controller 202 which operates a memory 204. The memory 204 may, in some embodiments, be an implementation of the memory device 100 of FIG. 1. Certain components are shown in FIG. 2 as part of a discussion of an ASPPR circuit and its operation.

The memory array 220 (e.g., memory array 118 of FIG. 1) includes a number of word lines WL0 to WLN and a number of redundant word lines RWL0 to RWLM. Although not shown in FIG. 2, the memory array 220 may be arranged into banks, each bank having its own set of word lines and redundant word lines. Each word line may be associated with a physical address which specifies that word line (e.g., PA0 to PAN). A word line engine 212 receives a logical address, such as XADD, and uses internal mapping to provide a physical address PA currently associated with that row address XADD. For example, if the row address XADD is associated with a first word line WL0, then the word line engine 212 may provide a physical address PA0.

The relationship between logical and physical addresses may change. For example, the word line engine 212 may remap logical and physical address relationships in order to improve wear leveling in the memory array 220. Accordingly, during a first access operation, the row address XADD may be associated with a first physical address PA0 and therefore a first word line WL0. During a second access operation (e.g., after wear leveling has been performed), the same row address XADD may be associated with a second physical address PA2, and thus a second word line PA2.

The controller 202 may perform access operations on the memory 204 by providing addresses, such as row address XADD, and various other commands, such as row activation command ACT. For example, the controller 202 may provide write data along data terminals along with a row address XADD. A command address circuit 210 provides the address to the word line engine 212, which converts the address XADD into a physical address PA, which the row decoder 222 uses to activate a corresponding word line.

The controller 202 may include a failure detection circuit 206 which locate defective word lines. For example, the failure detection circuit may test word lines by writing test data to an address, reading data from that address and then comparing the written and read data. If there are any discrepancies, the address may be identified as a defective address and provided to the memory 204 as part of an ASPPR operation. The controller 202 may operate in terms of logical addresses, such as XADD, while the defect is located in a specific physical word line, which in turn is tied to a physical address PA. The memory 204 may undergo wear leveling, where the relationship between logical and physical addresses changes. Accordingly, if the failure detection circuit 206 determines that a particular address is faulty, it may be important to preserve the physical address associated with the fault as rapidly as possible, before the relationship between the logical and physical addresses changes.

As part of an ASPPR operation, the controller 202 may provide an identified defective address XADD, along with various signals which indicate that the address XADD is part of an ASPPR operation. For example, the address XADD may be provided along a normal command/address (CA) bus to a CA input circuit 210 (e.g., 102 of FIG. 1) along with a row activation signal ACT and an ASPPR signal ASPPR. In some embodiments, the ASPPR signal may be provided to a mode register to set a flag PPR_Alert. The ASPPR signal may be used to set a flag because it may be used to later indicate to the memory 204 that an ASPPR operation was performed. In the embodiment of FIG. 2, a signal ASPPR is provided and the flag PPR_Alert is set in response to that. In some embodiments, the controller 202 may set the flag PPR_Alert as the ASPPR signal (e.g., by performing a mode register write operation). In some embodiments, the controller 202 may provide an ASPPR signal and the memory 204 may manage the state of the PPR_Alert flag. There may be multiple PPR_Alert flags, for example, one for each memory bank of the memory array 220. Each PPR_Alert flag may be associated with a different ASPPR operation.

After receiving the address XADD, the CA circuits 210 provide the address to the word line engine 212, which converts the address XADD into a physical address PA. This process may be similar to a normal access operation, and timing may be governed in part by the row activation signal ACT. Responsive to an ASPPR signal (and/or to the PPR_Alert flag being set), the ASPPR registers 218 may store the physical address PA. Each stored PA is associated with a redundant word line. In some embodiments, there may be a redundant word line in each bank set aside for ASPPR repair.

The physical address PA, associated with a defective word line, and identified by the controller 202 with a row address XADD, may be loaded into the ASPPR registers 218 within the timing set aside for a normal access operation. For example, the timing between the controller 202 providing the address XADD and the address PA being saved in the ASPPR registers 218 may be within a timing tRAS or less. This may help ensure that the relationship between the row address XADD identified by the controller 202 and the PA which specifies the defective word line is preserved until the physical address PA is saved in the memory 204.

During subsequent access operations, the controller 202 may provide a row address XADD associated with the access operation, which the word line engine 212 may convert to a physical address PA, which in turn may instruct the row decoder 222 which word line of the memory array 220 to access. The ASPPR registers 218 may compare (if an ASPPR operation and/or PPR operation is not being performed) the physical address from the word line engine to the stored physical addresses PA0 to PAk. If there is a match, the ASPPR registers 218 provide a match signal ASPPR Match. The ASPPR Match signal may override other memory operations, and may indicate that the current physical address PA was previously repaired as part of an ASPPR operation. Responsive to the signal ASPPR Match, the row decoder 222 may access the redundant row associated with the ASPPR register that the address PA was stored in. The signal ASPPR Match may trump other signals such as row access signals and other redundant signals (e.g., based on repairs in the fuse array 214 and fuse logic 216) to direct access to the redundant word line associated with the ASPPR register.

In some embodiments, when the row address PA is saved to the ASPPR registers, the information (e.g., a page of information) saved on the word line associated with the PA may be copied to the redundant word line which is associated with the ASPPR register that address is saved to. In this way, the data in that page of information may be preserved. In some embodiments, repair may be performed (e.g., using an ECC circuit) on the data as it is being copied, as the previous word line is defective. In some embodiments, the data may be copied as-is and may be repaired later.

In some embodiments, the row address XADD may specify a single page of information. Accordingly, the saved physical address PA may specify a single row of information. This may limit the amount of times the memory needs to access a redundant word line.

After an ASPPR operation has been performed, the controller 202 may decide to perform a PPR operation (e.g., a hard PPR or hPPR) operation to encode the repairs in the ASPPR registers 218 in a non-volatile format. Since the controller 202 does not know which physical addresses are stored in the ASPPR registers 218, the controller 202 may rely on the ASPPR registers 218 to specify which repairs to make. As part of a PPR operation, the controller 202 provides a PPR signal. If there are any PPR_Alert flags set in the mode register 208, indicating that at least one ASPPR operation has been performed, one or more physical addresses PA may be provided from the ASPPR registers 218 to the fuse logic 216. The fuse logic 216 may then blow fuses in the fuse array 214 to encode repairs to those physical addresses in a non-volatile format. As part of the PPR operation, the PPR_Alert flags may be cleared, and the stored physical addresses may be deleted from the ASPPR registers 218. This may allow for subsequent ASPPR repairs.

Once the repairs have been made in the fuse array 214, the fuse logic 216 may receive physical addresses PA from the word line engine 212 as part of access operations. If the physical address matches a repaired address stored in the fuse array 214, then the fuse logic 216 may provide a match signal Match. Responsive to Match, the row decoder 222 may access a redundant word line (unless the signal ASPPR Match is provided, in which case the accessed word line is associated with the ASPPR register).

Figure 3:
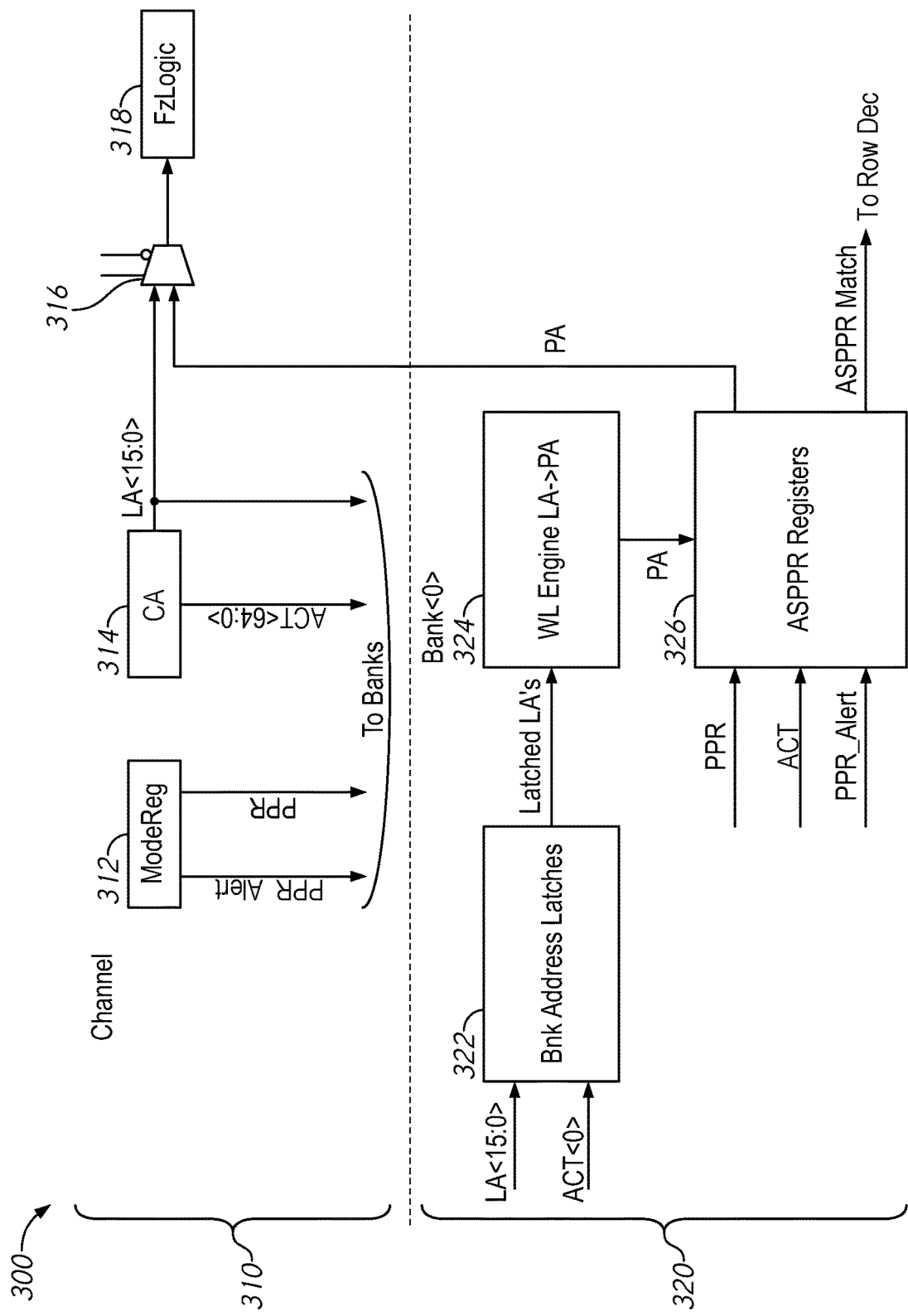
FIG. 3 is a schematic diagram of ASPPR logic according to some embodiments of the present disclosure.

FIG. 3 is a schematic diagram of ASPPR logic according to some embodiments of the present disclosure. The ASPPR logic 300 may, in some embodiments, be included in the memory device 100 of FIG. 1 and/or memory 204 of FIG. 2. The ASPPR logic 300 may generally be similar to the components and operations described with respect to the memory 204 of FIG. 2. The ASPPR logic 300 shows how different components may be divided between channel logic regions 310 of the memory and bank logic regions 320 of the memory. The bank logic regions 320 may include components which are repeated for each of the different banks. Thus, although a single bank logic region 320 (in this case Bank<0>) and set of logic circuits (e.g., bank address latches 322, word line engine 324, and ASPPR registers 326) are shown, each of these components may be repeated for each bank. For the sake of brevity, operations will be described with respect to only a single bank.

The channel logic region 310 includes a mode register 312 (e.g., 132 of FIG. 1 and/or 208 of FIG. 2), command address circuits 314 (e.g., 102 of FIG. 1 and/or 210 of FIG. 2), a multiplexer 316, and fuse logic 318 (e.g., 126 of FIG. 1 and/or 216 of FIG. 2). The mode register includes various storage elements which hold settings and adjustable values related to the operation of the memory. A controller (and/or the memory itself) may set various values in the mode register 312 to manage operations of the memory. In particular, the mode register 312 includes one or more PPR_Alert flags, which may indicate that an ASPPR operation is being performed when it is set, and may indicate an ASPPR operation was previously performed when it remains set. A PPR_Alert signal which reflects the state of the PPR_Alert flag may be provided to the bank logic region 320. In embodiments where each flag is associated with a given bank, the signal associated with that flag may be provided to the bank region associated with that flag. The mode register 312 also includes a PPR register which may be set to provide a PPR signal, which indicates that a PPR operation is being performed.

The CA circuit 314 provides a row activation command ACT and a logical address LA (e.g., XADD of FIGS. 1-2). The activation signal ACT may be a multi-bit signal, with each bit associated with a different bank. Accordingly, each bit of ACT may be provided to a different bank region, such as bank region 320, which receives ACT<0>. The logical address LA may also be a multi bit signal, which at its full length (e.g., 16 bits) may specify a single page (e.g., data along a single word line) of information. The logical address LA is provided to the bank region 320.

The bank region 320 includes bank address latches 322 which store logical addresses received along an address bus when that bank is being accessed. For example, the bank latches 322 may capture a logical address LA when the activation signal associated with that bank (e.g., ACT<0>) becomes active. The bank address latches 322 provide the latched logical address(es) LA to a word line engine 324, which converts the logical address LA to a physical address PA. The physical address PA may also be a multi-bit signal, but it may be linked to a specific word line (as opposed to the latched address LA, which specifies a page of data, and may change which word line it is associated with).

The physical address PA is provided to the ASPPR registers 326, which store the physical address PA responsive to the signals ACT<0> and the PPR_Alert flag signal from the mode register 312. The PPR_Alert flag signal may also be bank specific. In some embodiments, the mode register may only provide the signal PPR_Alert to the bank 320 when the flag is first set as part of an ASPPR operation, and not continue to provide the signal even if the flag remains set.

The ASPPR registers 326 may continue to receive physical addresses PA and the row activation signal ACT<0> as part of normal access operations. When the signal PPR_Alert is not active (e.g., an ASPPR operation is not being performed), the ASPPR registers 326 may compare the physical address PA to the previously stored physical addresses and provide the signal ASPPR. Match if there is a match between the received PA and one of the stored PAs. In some embodiments, the ASPPR registers 326 may only store a single address (e.g., one ASPPR address per bank). Each stored address may be associated with a specific redundant row of the bank. Responsive to the ASPPR Match signal, the row decoder may access that redundant row, instead of whichever row was previously associated with the address PA. In some embodiments, where the bank has more than one ASPPR redundant row, the signal ASPPR Match may indicate which redundant row to access.

The memory may enter a PPR mode when a PPR mode register is enabled. The mode register 312 may provide a PPR signal. Responsive to the PPR signal, the ASPPR registers 326 in one or more banks provide their stored physical addresses PA. The multiplexer may pass the logical address LA to the fuse logic 318 when the bad page flag is not set indicating no PA is stored in ASPPR registers (e.g., so the logical address LA can be stored in the fuse logic 318) and may pass physical addresses PA from the ASPPR registers 326 when a PPR operation is being performed. During a PPR operation, if any PPR_Alert flags were set in the mode register 312, indicating a previous ASPPR operation, the fuse logic 318 may write the temporary repairs from the ASPPR registers 326 to the fuse array to make those repairs permanent.

Figure 4:
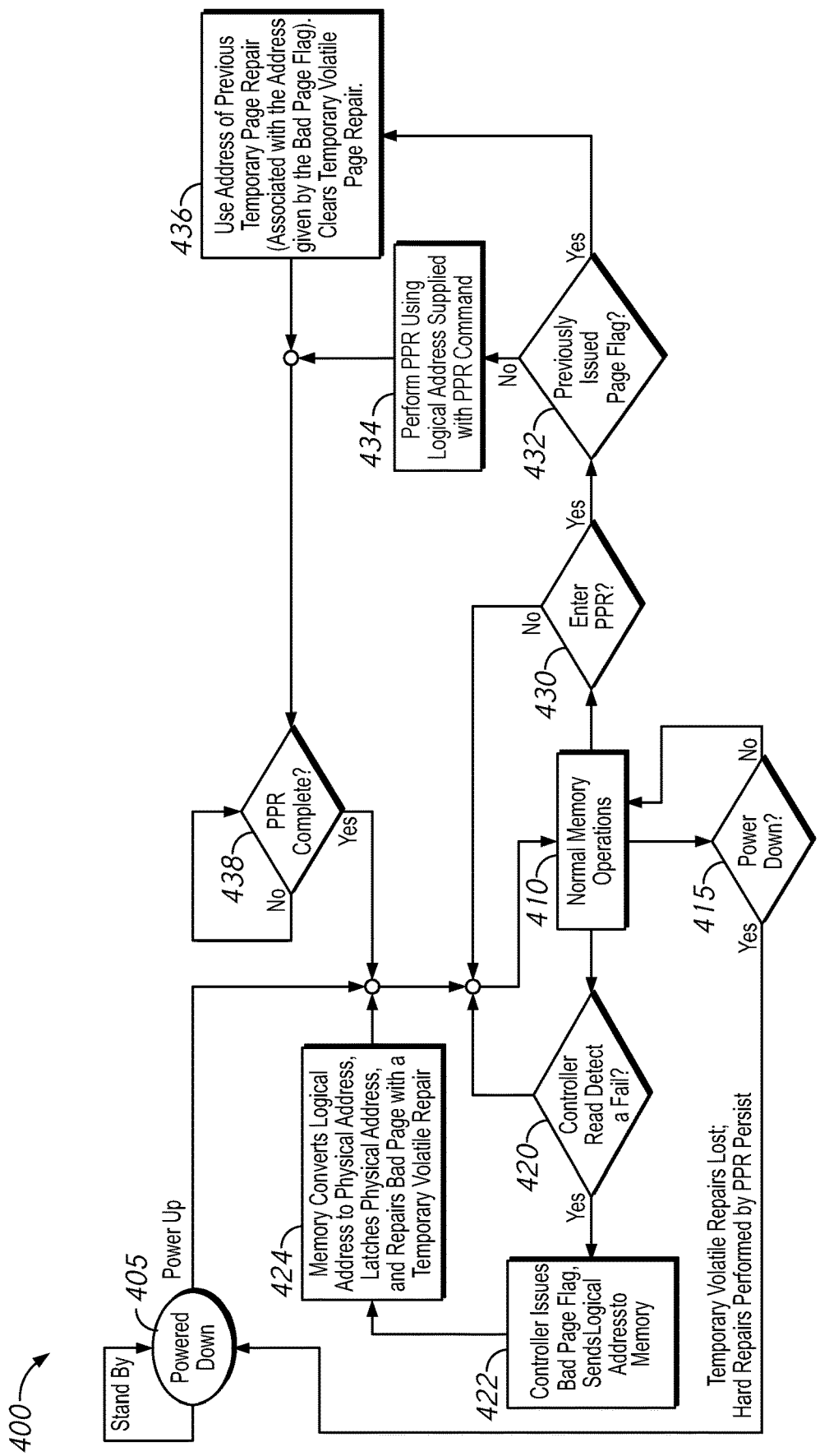
FIG. 4 is a flow chart of operations in a memory according to some embodiments of the present disclosure.

FIG. 4 is a flow chart of operations in a memory according to some embodiments of the present disclosure. The method 400 may be implemented by any or all of the components described with respect to FIGS. 1-3.

The method 400 includes step 405, which describes the memory in a powered down state. The memory may remain in a powered down state (e.g., in standby) until a power up signal is received, which moves the memory to state 410, which describes normal memory operations. During normal memory operations, a controller (e.g., 202 of FIG. 2) may for example, access the memory by providing commands and addresses across a CA bus. Box 415 describes a power down command, which may return the memory to state 405. When the memory is powered down, repairs made in a non-volatile fashion (e.g. hard repairs) such as those programmed in the fuse array, may be retained. Meanwhile, temporary repairs made in using volatile storage (e.g., ASPPR repairs) may be lost.

From block 410, normal memory operations, the memory may move into ASPPR operations based on block 420, which describes the controller detecting a failure. For example during a read operation, a failure detection circuit (e.g., 206 of FIG. 2) may determine that the read data is faulty (e.g., does not match the written data). The controller may note a logical address (e.g., XADD) associated with the detected failure. If a failure is not detected, the method 400 returns to box 410. If a failure is detected, the method 400 may proceed to box 422.

Box 422 describes issuing, from the controller, ASPPR commands and a logical address associated with the failure detected in box 420. For example, the controller may issue the logical address and a row activation command along a normal CA bus, and may also issue a bad page flag. The bad page flag may be written to a mode register of the memory. The method 400 may include setting a bad page flag (e.g., PPR_Alert) which may indicate that an ASPPR operation was performed.

Box 422 is followed by box 424, which describes the memory converting the logical address (e.g., XADD or LA) into a physical address and latching the physical address in an ASPPR register (e.g., 130 of FIG. 1, 218 of FIG. 2, and/or 326 of FIG. 3). The steps of box 424 may act as repairing the word line associated with the logical address (at the time it was detected as a failure) with a temporary repair, since the ASPPR register includes volatile elements. The timing from box 422 through box 424 may occur with timing similar to a normal access operation (e.g., within tRAS).

After box 424, the method may return to box 410, which describes normal operations. During normal operations, when rows are accessed, the method 400 may include receiving a logical address, converting the logical address into a physical address, and comparing the physical address to the stored physical address in the ASPPR registers. If there is a match, a redundant word line may be accessed instead of whichever wordline was previously associated with the physical address.

From the normal operations, the memory may enter a PPR mode at box 430. For example, the controller may provide a PPR signal and/or set a PPR mode flag in a mode register of the memory. If the PPR mode is entered, the method 400 may proceed to box 432, which describes checking to see if a page flag was previously issued (e.g., if an ASPPR repair was previously performed). For example, the page flag (e.g., PPR_Alert) may be active in the mode register if the page flag was previously issued. If there is no previously issued page flag, then the memory may enter box 434, which describes performing hard PPR using the logical address supplied with the PPR command. As part of being entered in the PPR mode (e.g., box 430), the memory may receive a row address (e.g., a logical address) which specifies a row to be repaired. If the page flag is not set (e.g., no previously issued page flag) then the fuse logic may blow one or more fuses based on the logical address provided with the PPR command.

If there was a previously issued bad page flag, then box 432 will be followed by box 436, which describes performing a hard PPR operation. Box 436 may include retrieving a physical address from the ASPPR registers and blowing one or more fuses (e.g., in fuse array 125 of FIG. 1 and/or 214 of FIG. 2) to encode the physical address in the fuse array. The box 436 may also include clearing the bad page flag. For example the box 436 may include unsetting the PPR_Alert flag in the mode register.

After boxes 434 or 436, the method 400 proceeds to box 438, checking to see if PPR operations are complete. If they are not (e.g., more addresses need to be programmed into the fuse array) then the method 400 may hold. If there are no more PPR operations, then the method 400 may return to normal memory operations 410. As part of normal memory operations, the memory may receive a row address, compare the row address to addresses programmed in the fuse array, and access redundant rows of memory if there is a match.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
accessing a row of a memory in a first amount of time; and
performing an automatic soft post-package repair (ASPPR) operation in a second amount of time, wherein the second amount of time is equal to or shorter than the first amount of time, and wherein the ASPPR operation includes:
receiving a row address along with a bad page signal;
generating a physical address based on the received row address with a word line engine; and
storing the physical address in an ASPPR register responsive to the bad page signal.

2. The method of claim 1, further comprising receiving the row address along a command/address bus, and providing the row address to the word line engine along an address bus of the memory.

3. The method of claim 1, further comprising setting a bad page flag in a mode register of the memory responsive to the bad page signal.

4. The method of claim 3, further comprising:
receiving a PPR command as part of a PPR operation;
checking a state of the bad page flag; and
blowing, responsive to the bad page flag being set, one or more fuses in a fuse array based on the physical address stored in the ASPPR register.

5. The method of claim 4, further comprising clearing the bad page flag responsive to the PPR operation.

6. The method of claim 1, wherein the ASPPR operation comprises:
receiving a second row address as part of an access operation;
generating a second physical address based on the second row address;
comparing the second physical address to the physical address stored in the ASPPR register;
accessing a redundant word line associated with the ASPPR register responsive to a match between the second physical address and the physical address.

7. The method of claim 1, wherein the ASPPR operation further includes copying data from a word line associated with the physical address to a redundant word line associated with the ASPPR register.

8. The method of claim 1, wherein the row address specifies a single page.

9. An apparatus comprising:
a memory array comprising a plurality of word lines and a redundant word line;
a word line engine configured to receive a row address and generate a physical address based on the row address, wherein the row address specifies a single page;
an automatic soft post package repair (ASPPR) circuit configured to store the physical address responsive to a bad page flag being set in a mode register.

10. The apparatus of claim 9, wherein the ASPPR circuit is further configured to receive a second physical address as part of an access operation, and provide a match signal responsive to the second physical address matching the stored physical address.

11. The apparatus of claim 10, further comprising a row decoder configured to access the redundant row of memory responsive to the match signal.

12. The apparatus of claim 9, wherein the word line engine is configured to receive the row address at a second time, after a wear leveling operation, and provide a second physical address different than the physical address.

13. The apparatus of claim 9, wherein the ASPPR circuit is configured to provide the stored physical address responsive to a PPR command; the apparatus further comprising a fuse logic circuit configured to blow one or more fuses of a fuse array based on the physical address from the ASPPR circuit and the PPR command.

14. The apparatus of claim 13, wherein the bad page flag is unset responsive to the PPR command.

15. The apparatus of claim 9, further comprising a command address (CA) circuit configured to receive the row address and provide the row address to the word line engine along an address bus.

16. The apparatus of claim 15, wherein a time from the CA circuit receiving the row address to the ASPPR circuit storing the physical address is within tRAS.

17. A system comprising:
a controller configured to provide a row address, a row activation command, and a bad page signal as part of an automatic post package repair (ASPPR) operation;
a memory comprising:
an address latch configured to latch the row address responsive to the row activation command;
a word line engine configured to convert the row address to a physical address; and
an ASPPR circuit configured to store the physical address responsive to the row activation command and a bad page flag set responsive to the bad page signal.

18. The system of claim 17, wherein the controller is further configured to provide a second row address and a second row activate command as part of an access operation.

19. The system of claim 18, wherein the memory performs the access operation in a first amount of time and performs the ASPPR operation in a second amount of time which is less than or equal to the first amount of time.

20. The system of claim 18, wherein the word line engine is further configured to generate a second physical address based on the second row address, and wherein the ASPPR circuit is configured to provide a match signal responsive to the second physical address matching the stored physical address, and the memory further comprising a row decoder configured to access a redundant row of memory responsive to the match signal.

21. The system of claim 17, wherein the controller is configured to provide a PPR signal as part of a PPR operation, the memory further comprising a fuse logic circuit configured to blow one or more fuses in a fuse array based on the physical address stored in the ASPPR circuit if the bad page flag is set.

22. The system of claim 21, wherein the memory is further configured to unset the bad page flag as part of the PPR operation.

* * * * *